United States Patent [19]

Tsutsui et al.

[11] 3,987,258
[45] Oct. 19, 1976

[54] WATER-PROOF SOUND APPARATUS

[75] Inventors: Katsumi Tsutsui; Takeuki Yamamoto, both of Fukuoka, Japan

[73] Assignee: Matsushita Electric Industrial Co., Ltd., Osaka, Japan

[22] Filed: Apr. 24, 1975

[21] Appl. No.: 571,105

[30] Foreign Application Priority Data

Apr. 30, 1974 Japan ................... 49-49752[U]

[52] U.S. Cl. .................. 179/179; 179/180; 181/149; 181/155; 325/352
[51] Int. Cl.² ................................. H04R 1/02
[58] Field of Search .......... 179/179, 180, 115.5 BS, 179/1 UW, 181 R; 181/148, 149, 150, 155, 173, 191, 194; 325/352, 361; 340/307, 2

[56] References Cited
UNITED STATES PATENTS

| | | | |
|---|---|---|---|
| 2,453,192 | 11/1948 | Bryant | 179/179 |
| 3,014,099 | 12/1961 | Fiala | 179/180 |
| 3,076,520 | 2/1963 | Farwell | 179/181 R |
| 3,162,813 | 12/1964 | Piccinini | 325/361 |
| 3,539,735 | 11/1970 | Marchand | 179/179 |
| 3,652,810 | 3/1972 | Weingartner | 179/179 |
| 3,674,108 | 7/1972 | Beatty | 181/149 |
| 3,789,166 | 1/1974 | Sebesta | 179/179 |

*Primary Examiner*—George G. Stellar
*Attorney, Agent, or Firm*—Stevens, Davis, Miller & Mosher

[57] ABSTRACT

A water-proof sound apparatus comprising a sealed cabinet, filter means attached to said cabinet which is permeable to gases and impermeable to liquids, a speaker attached to said cabinet which has a water-proof construction, and a grill covering the front of said speaker. The above sound apparatus when used can be floated in water, and it can be washed with city water and the like. The relationship between the outside atmospheric pressure and the pressure in the cabinet can be adjusted in accordance with the changes in the atmospheric temperature, the atmospheric pressure, and the temperature in the cabinet, so that an excellent sound effect can be attained at all times.

5 Claims, 7 Drawing Figures

3,987,258

WATER-PROOF SOUND APPARATUS

The present invention relates to a water-proof sound apparatus.

DESCRIPTION OF THE PRIOR ART

Publicly known sound apparatuses cannot be used while in contact with water or in dusty places. A number of water-proof radio receivers have been put on the market up to now. However, none of them have met actual use requirements satisfactorily.

SUMMARY OF THE INVENTION

An object of the present invention is to provide a water-proof sound apparatus which exhibits an excellent sound characteristic at all times independently of the changes in the atmospheric temperature, the atmospheric pressure, and the temperature in the cabinet.

Another object of the present invention is to provide a water-proof sound apparatus having a high-performance filter which is permeable to air and impermeable to water.

A further object of the present invention is to provide a water-proof sound apparatus in which the speaker is not damaged by the water applied violently thereto when the cabinet is washed with water.

A further object of the present invention is to provide a water-proof sound apparatus in which the water drops, dust, and the like adhering to the front of the speaker can be readily removed when the water-proof sound apparatus is used in the rain or is floated in sea water.

A further object of the present invention is to provide a water-proof sound apparatus in which a portion or the whole of the air-permeable and water-impermeable filter is exposed to air at all times, so that the relationship between the outside atmospheric pressure and the pressure in the cabinet can be adjusted any time the adjustment is needed.

A further object of the present invention is to provide a water-proof sound apparatus having protecting means for the air-permeable and water-impermeable filter.

In accordance with the present invention, there is provided a stout water-proof sound apparatus which has a completely sealed cabinet and exhibits a superb sound characteristic at all times independently of the changes in the atmospheric temperature, the atmospheric pressure, and the temperature in the cabinet.

FIG. 1b is a detailed view showing the filter section of the receiver of FIG. 1a.

DETAILED DESCRIPTION OF PREFERRED EMBODIMENTS

Hereunder an explanation will be made with reference to the accompanying drawings on a water-proof radio receiver which is an embodiment of the present invention.

Figure 1A:
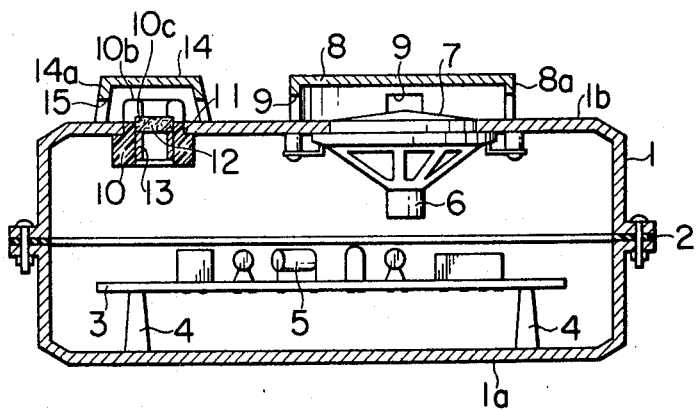
FIG. 1a is a sectional view showing the water-proof radio receiver in accordance with the present invention.
Figure 1B:
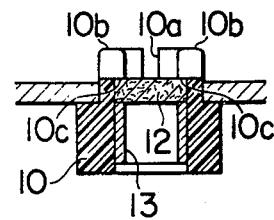
Figure 2:
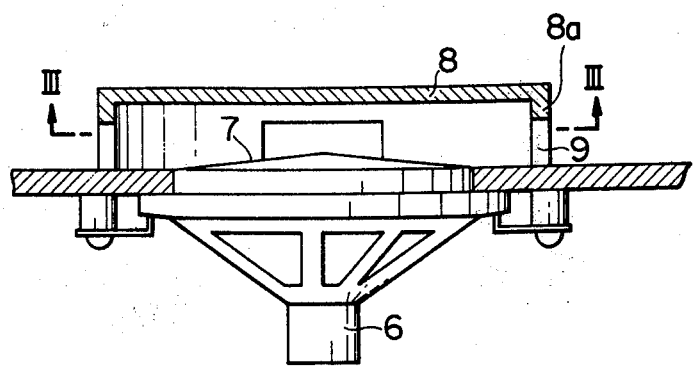
FIG. 2 is an enlarged sectional view illustrating the speaker section of the radio receiver in accordance with the present invention.
Figure 3:
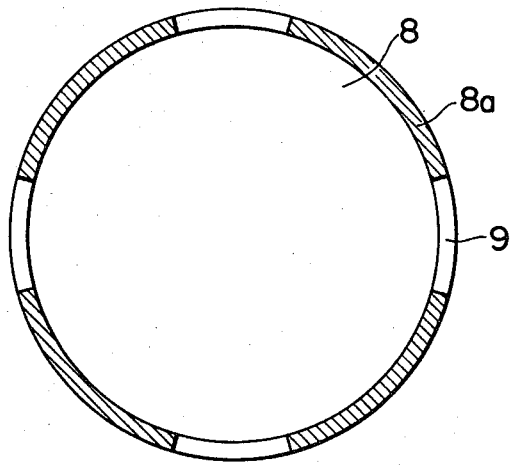
FIG. 3 is a sectional view taken along the line III—III of FIG. 2.
Figure 4:
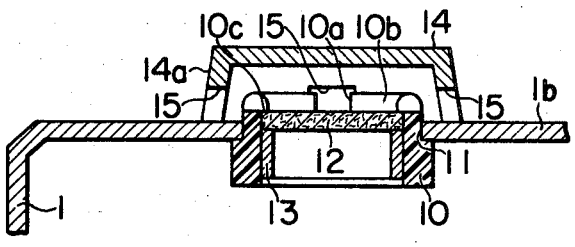
FIG. 4 is an enlarged sectional view showing the filter section of the radio receiver in accordance with the present invention.
Figure 5:
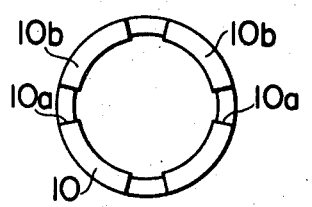
FIG. 5 is a plan view illustrating a fixture member for the filter.

Referring to the figures, a cabinet 1 for housing the component parts of the radio receiver is divided into two portions, i.e., half shells 1a and 1b, and a rubber seal 2 is disposed between the joining surfaces of the half shells 1a and 1b. A printed distribution base plate 3 is securely fixed to bosses 4 provided in the half shell 1a, and electronic parts 5 are arranged on the printed distribution base plate 3. A speaker 6 is attached to the half shell 1b of the cabinet 1. A diaphragm 7 on the front of the speaker 6 projects forwardly from the speaker 6. The surface of the diaphragm 7 has a coating of silicone resin and the like, so that the diaphragm 7 is rendered water-repellent and water-proof. A grill 8 is attached to the half shell 1b of the cabinet 1 in such a manner that the grill 8 covers the front surface of the diaphragm 7 of the speaker 6. Sound holes 9 are disposed in a side 8a of the grill 8. As best shown in FIGS. 4 and 5, a fixture member 10 for the filter fits to a through hole 11 in the half shell 1b of the cabinet 1. A plurality of notches 10a are arranged in the upper end of the fixture member 10 for the filter. The inner circumferential surfaces of circular edge portions 10b separated from one another by the notches 10a project inwardly from the inner circumferential surface of the fixture member 10 to form ribs 10c where the filter engages. A filter 12, which is made of a porous high molecular material, is supported between a filter fastening ring 13 and the ribs 10c of the fixture member 10 for the filter. The filter 12 consists of a filter portion and a reinforcing portion which are overlapped. The filter portion may have a thickness in the range from about 0.03 to 0.2 mm, and may be a polytetrafluoroethylene piece having a large number of fine pores with a diameter in the range from about 0.1 to 5 $\mu$. The reinforcing portion may have a thickness in the range from about 0.3 to 5 mm, and may be a polytetrafluoroethylene piece having a large number of fine pores with a diameter in the range from about 30 to 200 $\mu$. Alternatively the filter 12 may be made of a material such as porous fluorine rubber, polyethylene, polypropylene, silicone resin, silicone rubber, and the like. The filter 12 is protected by a protecting member 14 which is attached to the half shell 1b of the cabinet 1 in such a manner that the protecting member 14 covers the front surface of the filter 12. Air vents 15 are disposed in a side 14a of the protecting member 14.

In this embodiment, when the temperature in the cabinet 1 is increased by a cause such as the heat generated in the electronic parts 5 due to the use of the radio receiver, the exposure of the radio receiver to the sun, and the like, with the result that the air in the cabinet 1 expands and the pressure in the cabinet 1 rises, the air in the cabinet 1 is discharged to the outside through the filter 12 equalizing the outside atmospheric pressure and the pressure in the cabinet 1. If the radio receiver in accordance with the present invention is floated in cold water or is moved from a warm room to the open air to undergo a sudden decrease of the ambient temperature, the temperature in the cabinet 1 is reduced so that the air in the cabinet 1 contracts and the pressure in the cabinet 1 falls. However, the outside atmospheric pressure and the pressure in the cabinet 1 remain equal because the outside air flows into the cabinet 1 through the filter 12. When a difference is produced between the outside atmospheric pressure and the pressure in the cabinet 1 due to a cause such as the carrying of the radio receiver in accordance with the present invention in an airplane, air moves instantaneously through the filter 12 so that the outside atmospheric pressure and the pressure in the cabinet 1 are equalized. If the difference between the outside atmospheric pressure and the pressure in the cabinet 1 is allowed to be present, the diaphragm 7 of the speaker 6 is displaced toward the inside or the outside of the radio receiver owing to said difference, resulting in a decrease in the pressure of sound emitted from the speaker 6. In an extreme case, the diaphragm 7 will be damaged. In the present invention, in contrast to the above situation, if a difference is produced between the outside atmospheric pressure and the pressure in the cabinet 1, air moves through the filter 12 equalizing the outside atmospheric pressure and the pressure in the cabinet 1 and eliminating the possibility of a degraded sound effect.

As in general the cabinets of radio receivers are designed compact, a small amount of the air passing through the filter 12 is enough to equalize the outside atmospheric pressure and the pressure in the cabinet 1. If a water-permeable filter were used instead of the filter 12, water flowing through the water-permeable filter into the cabinet 1 would cause the component parts of the radio receiver to be exposed to a great danger of failure. For these reasons, the filter 12 must be positively impermeable to water even though the filter's air permeability is lowered to some degree on account of an increased drag to fluids. The amount of air passing through the filter will be sufficient if the filter is made of a high molecular material having fine pores with a diameter in the range from about 0.1 to 5 $\mu$. Polytetrafluoroethylene, which is a high molecular material, has a critical surface tension of about 17.5 dyne/cm$^2$, and if the filter is made of this material, water can be prevented satisfactorily from passing through the filter.

The cabinet of the water-proof radio receiver in accordance with the present invention can be washed with city water and the like when the radio receiver has gotten muddy or has been used in sea water. When washing the radio receiver, the water violently applied to the outer surfaces of the cabinet 1 cannot damage the diaphragm 7 of the speaker 6, because the grill 8 covers the front surface of the diaphragm 7 so that the diaphragm 7 may not be hit directly by a strong flow of water. The front surface of the filter 12 is also covered by the protecting member 14 to avoid a direct and violent application of water to the filter 12, with the result that the filter 12 is not damaged by water and water is prevented from flowing through the filter 12 into the cabinet 1.

The water-proof radio receiver in accordance with the present invention can be floated in water and can be used in the rain. On such occasions, water will enter the grill 8 through the sound holes 9 and reach the front surface of the diaphragm 7 of the speaker 6. However, thanks to the forwardly projecting shape of the front surface of the diaphragm 7, the water flows down toward the outer peripheral edge of the diaphragm 7 without collecting on the diaphragm 7, so that an outstanding sound effect can be achieved at all times. The dust lying on the diaphragm 7 falls down toward the outer peripheral edge of the diaphragm 7 in the same manner as the water since the front surface of the diaphragm 7 projects forwardly and the diaphragm 7 vibrates during the operation of the radio receiver.

Figure 6:
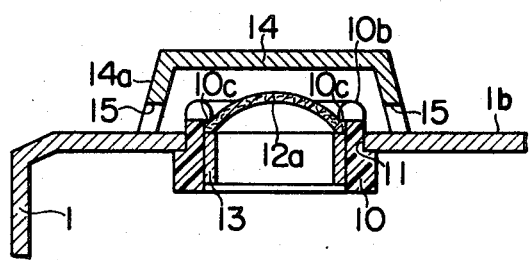
FIG. 6 is an enlarged view showing the filter section of another embodiment of the present invention.

Referring to FIG. 4, the water passing through the air vents 15 of the protecting member 14 and reaching the upper surface of the filter 12 flows down through the notches 10a of the fixture member 10, with the result that the filter 12 is exposed to air at all times. FIG. 6 shows a second embodiment of the present invention. In this embodiment, the water passing through air vents 15 and reaching a filter 12a flows down through the notches, with the result that the filter 12a is exposed to air at all times. In the second embodiment, no such notches may be necessary. The water passing through air vents 15 and reaching filter 12a collects between the outer peripheral edge of the filter 12a and a rib for engaging the filter 10c. However, the central portion of the filter 12a is exposed to air because the front surface of the filter 12a projects forwardly. Therefore, air can always pass through the filter 12a, so that the outer atmospheric pressure and the pressure in a cabinet 1 can be equal at all times.

In the water-proof radio receiver in accordance with the present invention, the filter 12 or 12a is never damaged by an external mechanical force since the protecting member 14 is attached to the half shell 1b of the cabinet 1 in such a manner that the protecting member 14 covers the front surface of the filter 12 or 12a.

Although the embodiments explained above are water-proof radio receivers, the present invention can be embodied in any kind of sound apparatus other than radio receivers.

As has been described in the foregoing, the present invention provides a very useful water-proof sound apparatus.

What is claimed is:

1. A water-proof sound apparatus comprising:
    a sealed cabinet;
    a through hole defined in one of the main surfaces of said sealed cabinet;
    a gas-permeable and liquid-impermeable filter fitted in said through hole;
    a speaker mounted in said one of the main surfaces of the sealed cabinet at a position apart from said filter, said speaker being water-proof and having a conical-shaped diaphragm which is projected from said one of the main surfaces of the sealed cabinet when the speaker is mounted in the sealed cabinet; and
    a protecting member attached to said cabinet and covering the front surface of said air-permeable and water-impermeable filter, said protecting member defining at least one through hole in at least one lateral side thereof to communicate said filter with the atmosphere and to drain water trapped within said protecting member.

2. A water-proof sound apparatus as defined in claim 1, wherein said air-permeable and water-impermeable filter is attached to the cabinet in such a manner that a portion or the whole of said filter is exposed to air when the cabinet is floated in water such that said filter and said speaker are faced upward.

3. A water-proof sound apparatus as defined in claim 1, further comprising a grill which has sound holes in the side thereof and covers the front surface of said speaker.

4. A liquid repellent sound transducing apparatus, comprising:
- a sealed cabinet having a through hole defined in one surface thereof;
- a gas-permeable, liquid-impermeable filter;
- means mounting said filter in said through hole, including a fixture member fitted in said through hole and having openings in a circumferential edge portion thereof to permit run off of liquid collecting on the outer surface of said filter, said filter being secured to said fixture member within said circumferential edge portion;
- a first cover member extending from said one cabinet surface and covering said filter, said first cover member having at least one through opening in a lateral side thereof to permit communication of said filter with the atmosphere and to permit drainage of liquid out of the space within said first cover member;
- a speaker mounted in said one cabinet surface at a location spaced from said filter, said speaker having a conical surface, the apex of which extends outwardly of said one cabinet surface, the surface of said speaker having a liquid repellent coating thereon; and
- a second cover extending from said one cabinet surface and covering said speaker, said second cover member having at least one through opening in a lateral side thereof to permit communication of said speaker with the atmosphere and to permit drainage of liquid out of the space within said second cover member.

5. The sound transducing apparatus according to claim 4, wherein said filter has an upwardly extending part-spherically shaped surface to facilitate drainage of liquid therefrom.

* * * * *